(12) United States Patent
Kawai

(10) Patent No.: US 11,272,614 B2
(45) Date of Patent: Mar. 8, 2022

(54) PRINTED WIRING BOARD AND METHOD FOR MANUFACTURING THE SAME

(71) Applicant: IBIDEN CO., LTD., Gifu (JP)

(72) Inventor: Satoru Kawai, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 17/080,898

(22) Filed: Oct. 27, 2020

(65) Prior Publication Data

US 2021/0136914 A1    May 6, 2021

(30) Foreign Application Priority Data

Oct. 30, 2019 (JP) .............................. JP2019-197301

(51) Int. Cl.
*H05K 1/11* (2006.01)
*H05K 3/06* (2006.01)

(52) U.S. Cl.
CPC ................. *H05K 1/11* (2013.01); *H05K 3/06* (2013.01); *H05K 2201/10984* (2013.01)

(58) Field of Classification Search
CPC ............. H05K 1/11–119; H05K 1/145; H05K 3/06–07
See application file for complete search history.

(56) References Cited

FOREIGN PATENT DOCUMENTS

JP            2010-129996 A        6/2010

*Primary Examiner* — Jeremy C Norris
(74) *Attorney, Agent, or Firm* — Oblon, McClelland, Maier & Neustadt, L.L.P.

(57) ABSTRACT

A printed wiring board includes a base insulating layer, a conductor layer formed on the base insulating layer and having a conductor pad, a solder resist layer formed on the base insulating layer such that the solder resist layer is covering the conductor layer and has an opening exposing the conductor pad in the conductor layer, and a bump formed on the conductor pad of the conductor layer and including a base plating layer formed in the opening of the solder resist layer, an intermediate layer formed on the base plating layer, and a top plating layer formed on the intermediate layer such that that the base plating layer has a side surface exposed from the solder resist layer and that the intermediate layer has a side surface protruding from the side surface of the base plating layer.

20 Claims, 2 Drawing Sheets

PRINTED WIRING BOARD AND METHOD FOR MANUFACTURING THE SAME

CROSS-REFERENCE TO RELATED APPLICATIONS

The present application is based upon and claims the benefit of priority to Japanese Patent Application No. 2019-197301, filed Oct. 30, 2019, the entire contents of which are incorporated herein by reference.

BACKGROUND OF THE INVENTION

Field of the Invention

The present invention relates to a printed wiring board having plating bumps and a method for manufacturing the printed wiring board.

Description of Background Art

Japanese Patent Application Laid-Open Publication No. 2010-129996 describes bump formation using a plating method. The entire contents of this publication are incorporated herein by reference.

SUMMARY OF THE INVENTION

According to one aspect of the present invention, a printed wiring board includes a base insulating layer, a conductor layer formed on the base insulating layer and having a conductor pad, a solder resist layer formed on the base insulating layer such that the solder resist layer is covering the conductor layer and has an opening exposing the conductor pad in the conductor layer, and a bump formed on the conductor pad of the conductor layer and including a base plating layer formed in the opening of the solder resist layer, an intermediate layer formed on the base plating layer, and a top plating layer formed on the intermediate layer such that that the base plating layer has a side surface exposed from the solder resist layer and that the intermediate layer has a side surface protruding from the side surface of the base plating layer.

According to another aspect of the present invention, a method for manufacturing a printed wiring board includes forming, on a base insulating layer, a conductor layer including a conductor pad, forming a solder resist layer on the base insulating layer such that the solder resist layer covers the conductor layer and has an opening exposing the conductor pad in the conductor layer, forming a seed layer such that the seed layer is formed on the conductor pad in the conductor layer, a surface of the solder resist layer and a side surface of the solder resist layer in the opening, and forming a bump on the conductor pad of the conductor layer such that the forming of the bump includes forming a base plating layer in the opening of the solder resist layer, forming an intermediate layer on the base plating layer, forming a top plating layer on the intermediate layer, and etching the seed layer such that the seed layer is removed from the surface of the solder resist layer. The etching of the seed layer includes etching a portion of the base plating layer such that a side surface of the base plating layer exposed from the solder resist layer is selectively etched and that a side surface of the intermediate layer protrudes from the side surface of the base plating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
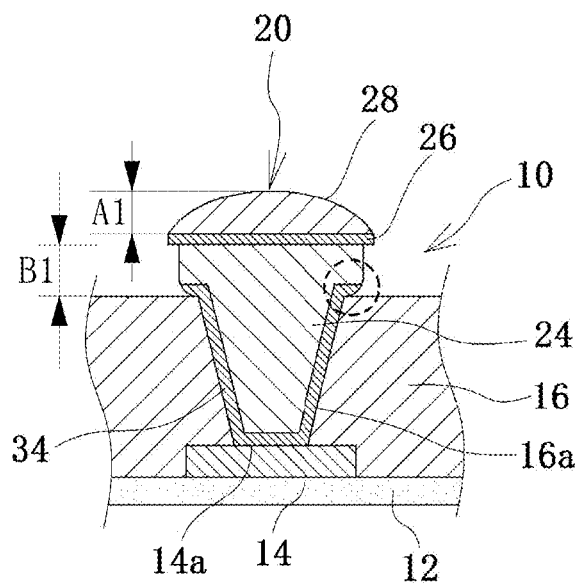
FIG. 1 is a diagram for describing a printed wiring board according to an embodiment of the present invention.

Embodiments will now be described with reference to the accompanying drawings, wherein like reference numerals designate corresponding or identical elements throughout the various drawings.

FIG. 1 is a diagram for describing a printed wiring board according to an embodiment of the present invention. FIG. 1 illustrates an enlarged view of a portion of a printed wiring board 10 of the embodiment. The printed wiring board 10 may be a substrate with a core formed by alternately laminating conductor layers and resin insulating layers on one side or both sides of a core substrate (not illustrated in the drawings), the conductor layers each having a predetermined circuit pattern. In the case where the conductor layers are formed on both sides of the core substrate, conductor layers opposing each other via the core substrate may be connected to each other via through-hole conductors (not illustrated in the drawings). Alternatively, the printed wiring board 10 may be a coreless substrate obtained by alternately laminating conductor layers and resin insulating layers on a support plate (not illustrated in the drawings) instead of a core substrate, and then removing the support plate. In any case, as illustrated in FIG. 1, the printed wiring board 10 includes at least a base insulating layer 12 which is arranged outermost among the resin insulating layers, a conductor layer 14 which is formed on the base insulating layer 12 and has a predetermined circuit pattern, and a solder resist layer 16 which is formed on the base insulating layer 12 and the conductor layer 14. Other multiple conductor layers and multiple resin insulating layers are often alternately provided below the base insulating layer 12, but are omitted in the drawings. However, it is also possible that the printed wiring board 10 is formed of one insulating layer (the base insulating layer 12) and one conductor layer (the conductor layer 14).

The base insulating layer 12 is formed of, for example, a resin composition or the like containing an inorganic filler, such as silica or alumina, and an epoxy resin. The conductor layer 14 is formed of a conductive metal, for example, a metal containing copper as a main component.

The solder resist layer 16 has an opening (16a) exposing a portion of the conductor layer 14 as a conductor pad (14a). An aspect ratio of the opening (16a), that is, a ratio of a depth to a diameter at a bottom thereof can be set to 0.5 or less. Further, the solder resist layer 16 is formed of a photo (UV) curable resin containing an inorganic filler, such as silica or alumina, and an epoxy resin.

Here, although not illustrated in the drawings, an underlayer may be formed on the conductor pad (14a). As the underlayer, a nickel layer formed on a surface of the conductor pad (14a), a palladium layer formed on the nickel layer, and an Au layer formed on the palladium layer can be exemplified. In addition, a nickel layer and an Au layer formed on the nickel layer can be exemplified.

The printed wiring board 10 further includes a bump 20 formed on the conductor pad (14a). When the underlayer is not formed, the bump 20 can be directly formed on the conductor pad (14a).

The bump 20 has: a seed layer 34 that is formed in the opening (16a) and is formed of, for example, copper; a base plating layer 24 that is formed on the seed layer 34; and a top plating layer 28 that is formed on the base plating layer 24 via an intermediate layer 26 containing, for example, nickel as a main component. The intermediate layer 26 preferably has a thickness of 7 μm or less.

The base plating layer 24 is formed of a conductive metal, preferably a metal containing copper as a main component. The base plating layer 24 is formed to a height exceeding a surface of the solder resist layer 16 (a surface on an opposite side with respect to the base insulating layer 12). As a result, the bump 20 is stably held in the opening (16a). A thickness (B1) of the base plating layer 24 measured from the surface of the solder resist layer 16 is preferably in a range of 3 μm-20 μm.

The top plating layer 28 is formed of a metal which has a lower melting point than the base plating layer 24 and which is melted by a reflow treatment and is shaped into a substantially hemispherical shape as illustrated in FIG. 1, for example, a metal containing tin as a main component. A thickness (A1) of the top plating layer 28 (a distance in a vertical direction measured from a lower end of the top plating layer 28 to a top of the top plating layer on an outer peripheral surface of the bump 20) is preferably set in a range of 5 μm-45 μm. By setting the thickness (A1) of the top plating layer 28 in this range, good connection reliability can be achieved between the bump 20 and a connection pad (not illustrated in the drawings) of an electronic component such as a semiconductor chip or a memory mounted on the printed wiring board 10.

In the printed wiring board having the plating bump having the above-described structure, a feature of the embodiment of the present invention is that a side surface of the intermediate layer 26 protrudes to an outer side of a side surface of the base plating layer 24 exposed from the solder resist layer 16, for example, in a range of 2 μm-5 μm. Therefore, the top plating layer 28 formed on the intermediate layer 26 does not flow beyond the intermediate layer 26 to the side surface of the base plating layer 24 exposed from the solder resist layer 16 even when the top plating layer 28 is melted by a reflow treatment. As a result, a short circuit between bumps due to a solder of the top plating layer 28 is suppressed.

As illustrated in a portion surrounded by a dotted line in FIG. 1, the side surface of the base plating layer 24 exposed from the solder resist layer 16 may have an undercut shape. As a result, a crack is unlikely to enter the surface of the solder resist layer around the bump.

Figure 2:
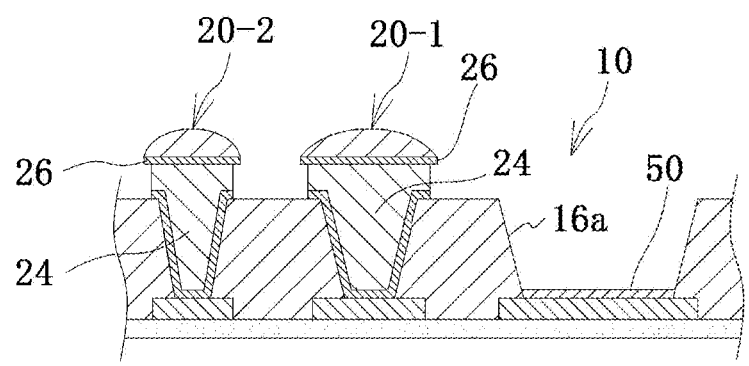
FIG. 2 is a diagram for describing a printed wiring board according to another embodiment of the present invention.

FIG. 2 is a diagram for describing another embodiment of the printed wiring board of the present invention. In a printed wiring board 10 illustrated in FIG. 2, bumps 20 include a first bump (20-1) and a second bump (20-2), which has a smaller diameter than the first bump (20-1). Structures of the first bump (20-1) and the second bump (20-2) are the same as the structure of the bump 20 illustrated in FIG. 1 except for the difference in diameter. In the printed wiring board 10 illustrated in FIG. 2, for both the first bump (20-1) and the second bump (20-2), the intermediate layer 26 protrudes to an outer side of the side surface of the base plating layer 24. Further, in the printed wiring board 10 illustrated in FIG. 2, in addition to the first bump (20-1) and the second bump (20-2), an opening (16a) is provided in which, without forming a bump, an underlayer 50 including an Au layer is formed on the conductor layer 14. A component such as a capacitor can be mounted on the underlayer 50 when necessary.

FIGS. 3(a)-3(f) are diagrams for describing processes of a method for manufacturing a printed wiring board according to an embodiment of the present invention. The processes illustrated in FIGS. 3(a)-3(f) are illustrated using processes for manufacturing the printed wiring board illustrated in FIG. 2 as an example.

Figure 3A:
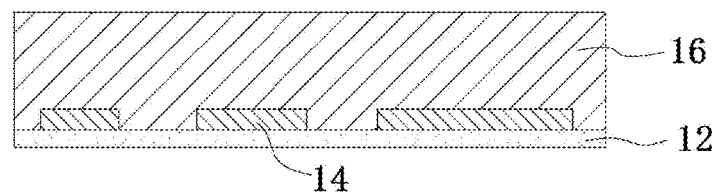
FIGS. 3(a)-3(f) are diagrams for describing processes of a method for manufacturing a printed wiring board according to an embodiment of the present invention.

FIG. 3(a) illustrates an intermediate in which the conductor layer 14 and the solder resist layer 16 are formed on the base insulating layer 12 using a known method, the conductor layer 14 having a predetermined circuit pattern. Other multiple conductor layers and multiple resin insulating layers are often alternately formed below the base insulating layer 12, but are omitted in the drawings. The multiple conductor layers and the multiple resin insulating layers can be laminated on a core substrate or on a support plate that can be removed afterwards. However, it is also possible that the printed wiring board 10 is formed from one resin insulating layer as the base insulating layer 12 and one conductor layer as the conductor layer 14. In this case, the resin insulating layer corresponds to the base insulating layer 12. For the base insulating layer 12, an insulating resin film for a build-up layer containing inorganic filler such as silica or alumina and an epoxy resin can be used. The conductor layer 14 preferably has a thickness of 20 μm or less.

Figure 3B:
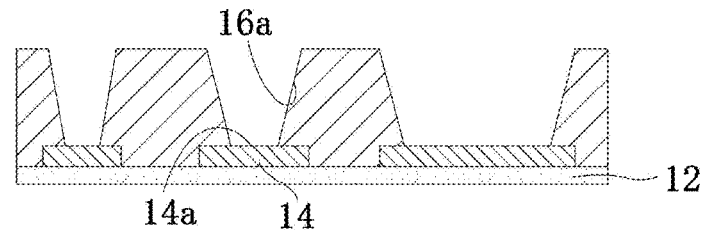

Next, as illustrated in FIG. 3(b), the opening (16a) exposing a portion of the conductor layer 14 as the conductor pad (14a) is formed in the solder resist layer 16 using a method in which a laser is used or a method in which a plasma treatment is used.

Figure 3C:
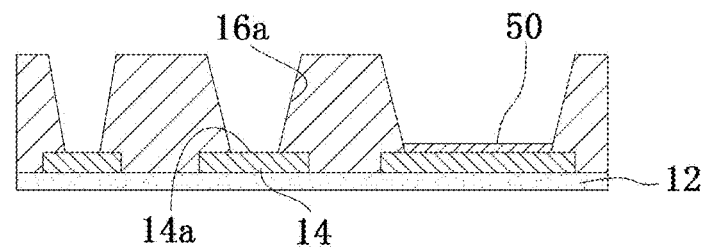

Next, as illustrated in FIG. 3(c), in a state in which portions of the conductor layer 14 at planned formation sites of the bumps are covered with a mask (not illustrated in the drawings), the underlayer 50 is formed on a portion of the conductor layer 14 where a bump is not formed. The underlayer 50 may include an Au layer. As the underlayer 50, a nickel layer formed on a surface of the conductor pad (14a), a palladium layer formed on the nickel layer, and an Au layer formed on the palladium layer can be exemplified. In addition, a nickel layer and an Au layer formed on the nickel layer can be exemplified.

Figure 3D:
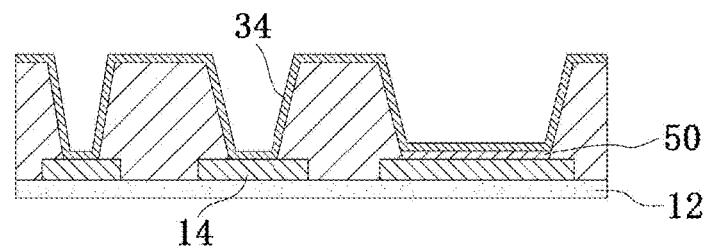

Next, as illustrated in FIG. 3(d), for example, by an electroless plating treatment such as an electroless copper plating treatment, a seed layer 34 formed of Cu is formed on the conductor layer 14 and on the surface of the solder resist layer 16 and the side surface of the opening (16a).

Figure 3E:
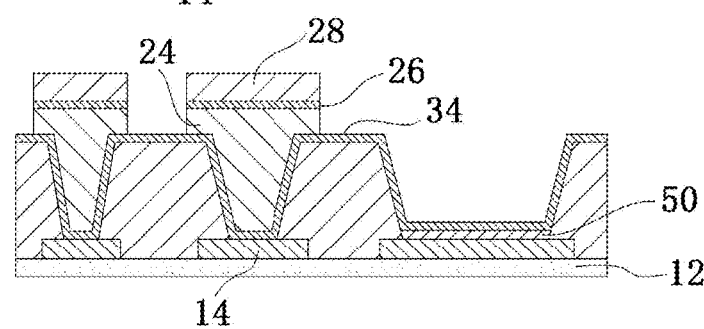
Figure 3F:
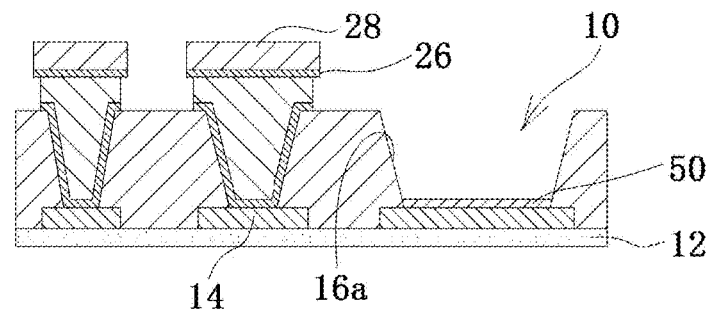

Next, as illustrated in FIG. 3(e), in a state in which a portion of the conductor layer 14 where a bump is not to be formed is covered with a mask (not illustrated in the drawings), for example, an electrolytic plating treatment is performed according to a known method, and, the base plating layer 24 containing, for example, copper as a main component is formed on the seed layer 34 in the opening (16a) where a bump is to be formed, the intermediate layer 26 containing, for example, nickel as a main component is formed on the base plating layer 24, and the top plating layer 28 is formed on the intermediate layer 26. The top plating layer 28 is formed of a metal which has a lower melting point than the base plating layer 24 and which is melted by a reflow treatment and is shaped into a substantially hemispherical shape, for example, a metal containing tin as a main component.

Next, as illustrated in FIG. 3(*f*), an exposed portion of the seed layer 34 is removed by etching according to a known method. A feature according to the embodiment of the present invention is that, in removing the seed layer 34 by etching, a side surface of an exposed portion of the base plating layer 24 formed of Cu is etched by selectively etching Cu. As a result, the intermediate layer 26 protrudes to an outer side of the side surface of the base plating layer 24. After that, by performing reflow treatment to shape the top plating layer 28, the printed wiring board 10 according to the embodiment of the present invention can be obtained.

As illustrated in FIG. 3(*f*), in the printed wiring board 10, when the opening (16*a*) that has the underlayer 50 and in which a bump is not formed is provided, an effect can be achieved that, in addition to the above-described reduction in diameter of the side surface of the base plating layer 24 due to etching for removing the seed layer 34, the side surface of the base plating layer 24 electrically connected to the underlayer 50 is further etched by a battery reaction between the underlayer 50 and the base plating layer 24 so that the intermediate layer 26 further protrudes to an outer side of the side surface of the base plating layer 24.

According to the above-described method for manufacturing a printed wiring board according to an embodiment of the present invention, as described above, by using the etching for removing the seed layer 34 formed of Cu to etch the side surface of the exposed portion of the base plating layer 24 formed of Cu, and, in addition, by etching the side surface of the exposed portion of the base plating layer 24 formed of Cu by a battery reaction between the underlayer 50 and the base plating layer 24, the side surface of the intermediate layer 26 can protrude to an outer side of the side surface of the base plating layer 24 exposed from the solder resist layer 16, for example, in the range of 2 μm-5 μm.

Further, in the example illustrated in FIGS. 3(*a*)-3(*f*), the case is described where the printed wiring board 10 illustrated in FIG. 2 in which the first bump (20-1), the second bump (20-2), and the opening (16*a*) that exposes the underlayer 50 and in which a bump is not formed is manufactured. However, by applying the processes also to the example of the single bump illustrated in FIG. 1 or the example in which a single bump and the opening (16*a*) that exposes the underlayer 50 and in which a bump is not formed are provided, the printed wiring board according to the embodiment of the present invention can be obtained.

The bump formation in the method described in Japanese Patent Application Laid-Open Publication No. 2010-129996 is carried out by forming an opening on a pad in a solder resist layer using laser, and performing Cu plating and solder plating in the opening. In this case, there is a risk that an outermost solder plating layer of a bump for connecting with other components may spread to a side surface of a Cu plating layer, causing a short circuit between bumps.

A printed wiring board according to an embodiment of the present invention includes: a base insulating layer; a conductor layer that is formed on the base insulating layer; a solder resist layer that is formed on the base insulating layer and on the conductor layer, and has an opening exposing a portion of the conductor layer as a conductor pad; and a bump formed on the conductor pad. The bump has a base plating layer formed in the opening, an intermediate layer formed on the base plating layer, and a top plating layer formed on the intermediate layer. A side surface of the intermediate layer protrudes to an outer side of a side surface of the base plating layer exposed from the solder resist layer.

Further, a method for manufacturing a printed wiring board according to an embodiment of the present invention includes: forming a base insulating layer; forming a conductor layer on the base insulating layer; forming a solder resist layer on the base insulating layer and on the conductor layer; forming an opening in the solder resist layer, the opening exposing a portion of the conductor layer as a conductor pad; forming a seed layer on the conductor layer and on a surface of the solder resist layer and a side surface of the opening; and forming a bump on the conductor pad. The forming of the bump includes: forming a base plating layer in the opening; forming an intermediate layer on the base plating layer; forming a top plating layer on the intermediate layer; and removing the seed layer on the surface of the solder resist layer by etching. The removing of the seed layer by etching includes causing a side surface of the intermediate layer to protrude to an outer side of a side surface of the base plating layer exposed from the solder resist layer by selectively etching the side surface of the base plating layer exposed from the solder resist layer.

According to an embodiment of the present invention, by causing the side surface of the intermediate layer to protrude to an outer side of the side surface of the base plating layer exposed from the solder resist layer, solder of the top plating layer formed on the intermediate layer does not flow to the side surface of the base plating layer. Therefore, a short circuit between bumps due to the solder of the top plating layer is suppressed.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
 a base insulating layer;
 a conductor layer formed on the base insulating layer and having a conductor pad;
 a solder resist layer formed on the base insulating layer such that the solder resist layer is covering the conductor layer and has an opening exposing the conductor pad in the conductor layer; and
 a bump formed on the conductor pad of the conductor layer and comprising a base plating layer formed in the opening of the solder resist layer, an intermediate layer formed on the base plating layer, and a top plating layer formed on the intermediate layer such that the base plating layer has a side surface exposed from the solder resist layer and that the intermediate layer has a side surface protruding from the side surface of the base plating layer.

2. The printed wiring board according to claim 1, further comprising:
 a second bump having a diameter smaller than a diameter of the bump,
 wherein the conductor layer includes a second conductor pad, the solder resist layer has a second opening exposing the second conductor pad, and the second bump is formed on the second conductor pad of the conductor layer and comprising a second base plating layer formed in the second opening of the solder resist layer, a second intermediate layer formed on the second base plating layer, and a second top plating layer formed on the second intermediate layer such that the second base plating layer has a side surface exposed from the solder resist layer and that the second intermediate layer has a side surface protruding from the side surface of the second base plating layer.

3. The printed wiring board according to claim 2, further comprising:
a metal layer comprising Au,
wherein the conductor layer includes a third conductor pad, the solder resist layer has a third opening exposing the third conductor pad, and the metal layer is formed on the third conductor pad of the conductor layer.

4. The printed wiring board according to claim 2, wherein the bump is formed on the conductor pad of the conductor layer such that the side surface of the intermediate layer is protruding in a range of from 2 μm to 5 μm from the side surface of the base plating layer.

5. The printed wiring board according to claim 2, wherein the conductor layer has a thickness of 20 μm or less.

6. The printed wiring board according to claim 2, wherein the bump is formed such that the top plating layer has a thickness in a range of from 5 μm to 45 μm.

7. The printed wiring board according to claim 2, wherein the bump is formed such that the base plating layer is protruding in a range of from 3 μm to 20 μm from a surface of the solder resist layer.

8. The printed wiring board according to claim 2, wherein the bump is formed such that a main component of the intermediate layer is nickel.

9. The printed wiring board according to claim 2, wherein the bump is formed such that a main component of the base plating layer is copper, a main component of the intermediate layer is nickel, and a main component of the top plating layer is tin.

10. The printed wiring board according to claim 1, further comprising:
a metal layer comprising Au,
wherein the conductor layer includes a second conductor pad, the solder resist layer has a second opening exposing the second conductor pad, and the metal layer is formed on the second conductor pad of the conductor layer.

11. The printed wiring board according to claim 10, wherein the bump is formed on the conductor pad of the conductor layer such that the side surface of the intermediate layer is protruding in a range of from 2 μm to 5 μm from the side surface of the base plating layer.

12. The printed wiring board according to claim 1, wherein the bump is formed on the conductor pad of the conductor layer such that the side surface of the intermediate layer is protruding in a range of from 2 μm to 5 μm from the side surface of the base plating layer.

13. The printed wiring board according to claim 1, wherein the conductor layer has a thickness of 20 μm or less.

14. The printed wiring board according to claim 1, wherein the bump is formed such that the top plating layer has a thickness in a range of from 5 μm to 45 μm.

15. The printed wiring board according to claim 1, wherein the bump is formed such that the base plating layer is protruding in a range of from 3 μm to 20 μm from a surface of the solder resist layer.

16. The printed wiring board according to claim 1, wherein the bump is formed such that a main component of the intermediate layer is nickel.

17. The printed wiring board according to claim 1, wherein the bump is formed such that a main component of the base plating layer is copper, a main component of the intermediate layer is nickel, and a main component of the top plating layer is tin.

18. The printed wiring board according to claim 1, further comprising:
an underlayer formed between the bump and the conductor pad in the conductor layer.

19. A method for manufacturing a printed wiring board, comprising:
forming, on a base insulating layer, a conductor layer including a conductor pad;
forming a solder resist layer on the base insulating layer such that the solder resist layer covers the conductor layer and has an opening exposing the conductor pad in the conductor layer;
forming a seed layer such that the seed layer is formed on the conductor pad in the conductor layer, a surface of the solder resist layer and a side surface of the solder resist layer in the opening; and
forming a bump on the conductor pad of the conductor layer such that the forming of the bump includes forming a base plating layer in the opening of the solder resist layer, forming an intermediate layer on the base plating layer, forming a top plating layer on the intermediate layer, and etching the seed layer such that the seed layer is removed from the surface of the solder resist layer,
wherein the etching of the seed layer includes etching a portion of the base plating layer such that a side surface of the base plating layer exposed from the solder resist layer is selectively etched and that a side surface of the intermediate layer protrudes from the side surface of the base plating layer.

20. The method for manufacturing a printed wiring board according to claim 19, further comprising;
forming a metal layer comprising Au on a second pad in the conductor layer; and
electrically connecting the metal layer such that the side surface of the base plating layer is etched by a battery reaction between the metal layer and the base plating layer,
wherein the forming of the solder resist layer includes forming a second opening exposing the second pad in the conductor layer, and the forming of the metal layer comprises forming the metal layer on the second pad exposed by the second opening of the solder resist layer.

* * * * *